(12) United States Patent
Shinozaki et al.

(10) Patent No.: US 8,208,093 B2
(45) Date of Patent: Jun. 26, 2012

(54) LIGHT-EMITTING DEVICE, DISPLAY DEVICE AND METHOD OF MANUFACTURING LIGHT-EMITTING DEVICE

(75) Inventors: Kenji Shinozaki, Ichihara (JP); Yoshinori Abe, Ichihara (JP)

(73) Assignee: Showa Denko K.K., Tokyo (JP)

( * ) Notice: Subject to any disclaimer, the term of this patent is extended or adjusted under 35 U.S.C. 154(b) by 345 days.

(21) Appl. No.: 12/301,518

(22) PCT Filed: Apr. 15, 2008

(86) PCT No.: PCT/JP2008/057355
§ 371 (c)(1),
(2), (4) Date: Nov. 19, 2008

(87) PCT Pub. No.: WO2009/001606
PCT Pub. Date: Dec. 31, 2008

(65) Prior Publication Data
US 2010/0177258 A1      Jul. 15, 2010

(30) Foreign Application Priority Data

Jun. 28, 2007   (JP) ................................. 2007-170411

(51) Int. Cl.
*G02F 1/1335* (2006.01)
(52) U.S. Cl. ......................................................... 349/69
(58) Field of Classification Search ...................... 349/69
See application file for complete search history.

(56) References Cited

U.S. PATENT DOCUMENTS

| | | | |
|---|---|---|---|
| 7,710,016 B2 | 5/2010 | Miki et al. | |
| 7,723,407 B2 | 5/2010 | Sugioka et al. | |
| 2005/0122031 A1 | 6/2005 | Itai et al. | |
| 2005/0224830 A1* | 10/2005 | Blonder et al. | 257/100 |
| 2006/0023448 A1* | 2/2006 | Mok et al. | 362/231 |
| 2006/0029811 A1 | 2/2006 | Sugioka et al. | |
| 2006/0186431 A1 | 8/2006 | Miki et al. | |
| 2007/0121023 A1* | 5/2007 | Yang | 349/58 |
| 2009/0231833 A1 | 9/2009 | Miki et al. | |

FOREIGN PATENT DOCUMENTS

| | | |
|---|---|---|
| JP | 2003-258313 A | 9/2003 |
| JP | 2006-324589 A | 11/2006 |
| JP | 2007-27433 A | 2/2007 |
| JP | 2007-95674 A | 4/2007 |
| TW | 200606208 | 2/2006 |
| TW | 200644284 | 12/2006 |

\* cited by examiner

*Primary Examiner* — Phu Vu
(74) *Attorney, Agent, or Firm* — Sughrue Mion, PLLC

(57) ABSTRACT

Plural LEDs 21 are mounted on a top surface 20*a* of a circuit board 20, and a circuit pattern 22 for supplying power to the LEDs 21 and metallic film islands 23 for heat radiation are provided on a back surface 20*b*. Further, lens 30 is provided on the top surface 20*a* of the circuit board 20, that is, a surface where the circuit pattern 22 and the metallic film islands 23 are not provided, so as to cover each of the LEDs 21. The lens 30 is cured after dripping a liquid resin including a silicone resin containing silica. Therefore, distortion of the cover members formed on the substrate by dripping the liquid resin is suppressed.

3 Claims, 4 Drawing Sheets

LIGHT-EMITTING DEVICE, DISPLAY DEVICE AND METHOD OF MANUFACTURING LIGHT-EMITTING DEVICE

TECHNICAL FIELD

The present invention relates to a light-emitting device, a display device and a method of manufacturing the light-emitting device.

BACKGROUND ART

In recent years, various light-emitting devices in which plural solid-state light-emitting elements such as light-emitting diodes (LEDs) are mounted on a substrate for use as a light source have come into practical use. Such light emitting devices are widely used, for example, as a matrix display device in which a matrix of plural LEDs emits light selectively to display characters or images, a backlight for a liquid crystal panel of a liquid crystal display device, or the like.

In such a light-emitting device, each of the LEDs mounted on the substrate is covered with a transparent cover member, in most cases. The cover member is used, for example, to protect or seal the LED or to refract, in a desired direction, an optical path of light emitted from the LED.

Heretofore, there has been a proposal of a molding method for forming a lens-shaped cover member for an LED mounted on a substrate. Specifically, the method includes forming a pair of opening holes in the vicinity of the LED mounted on the substrate; and setting, on one surface of the substrate, an upper mold provided with a cavity in a predetermined form of lens for the mounted LED, and on the other surface thereof, a lower mold provided with a different runner serving as a pouring basin corresponding to the cavity. The method includes then injecting a molding liquid resin from the runner provided in the lower mold into the cavity in the form of lens via the opening holes; and subsequently curing the liquid resin, thereby forming the cover member over the LED (for example, refer to Patent Document 1).

Patent Document 1: Japanese Patent Application Laid Open Publication No. 2007-27433

DISCLOSURE OF THE INVENTION

Problems to be Solved by the Invention

Here, when the mold is used for the formation of the cover member, it is difficult to achieve an improvement in production efficiency, because the substrate needs to be attached to the molds such as the upper and lower molds before the injection of the resin, or needs to be detached from the molds after the injection of the resin.

Instead of this, what is called a dispensing or potting method may be adopted to form the cover member by dripping the liquid resin onto the substrate. However, the liquid resin flows in indefinite form on the substrate when dripped on the substrate and thus has difficulty in forming the cover member of a desired shape.

The present invention has been made in order to address the foregoing technological problems. An object of the present invention is to suppress distortion of the cover member formed on the substrate by dripping the liquid resin.

Means for Solving the Problems

A light-emitting device to which the present invention is applied is provided with: a plurality of solid-state light-emitting elements; a substrate that has a first surface on which the plurality of solid-state light-emitting elements are mounted, and a second surface on which circuit pattern is formed, the second surface being opposite to the first surface, the wiring electrically connecting the plurality of solid-state light emitting elements; and a cover member that is formed by curing a liquid resin dripped on the first surface of the substrate, and that covers each of the plurality of solid-state light-emitting elements.

In such a light-emitting device, the liquid resin is formed of a transparent resin containing a thixotropic agent.

According to another aspect of the present invention, there is provided a display device including a display panel that displays an image, and a backlight that faces a back side of the display panel and irradiates the display panel with light from the back side of the display panel. The backlight is provided with: a plurality of solid-state light-emitting elements; a substrate that has a first surface facing the display panel, on which the plurality of solid-state light-emitting elements are mounted, and a second surface on which circuit pattern is formed, the second surface being opposite to the first surface, the wiring electrically connecting the plurality of solid-state light emitting elements; and a cover member that is formed by curing a liquid resin dripped on the first surface of the substrate, and that covers each of the plurality of solid-state light-emitting elements.

According to further aspect of the present invention, there is provided a method of manufacturing a light-emitting device including: mounting a plurality of solid-state light-emitting elements on one surface of the substrate opposite to the other surface on which circuit pattern is formed; placing the substrate so that the plurality of solid-state light-emitting elements are located on an upper portion of the substrate in a vertical direction, and dripping a liquid resin onto the one surface of the substrate; and forming a cover member by curing the liquid resin dripped on the one surface of the substrate.

Here, a transparent resin containing a thixotropic agent is used as the liquid resin at dripping the liquid resin. Further, forming the cover member includes placing the substrate so that the liquid resin dripped on the substrate is located on a lower portion of the substrate in the vertical direction, and performing heat processing on the liquid resin.

Advantages of the Invention

According to the present invention, it is possible to suppress distortion of the cover member formed on the substrate by dripping the liquid resin.

BEST MODES FOR CARRYING OUT THE INVENTION

Hereinafter, exemplary embodiments of the present invention will be described in detail with reference to the accompanying drawings.

FIG. 1 is a view showing an entire configuration of a liquid crystal display device to which an exemplary embodiment is applied. The liquid crystal display device to which the present exemplary embodiment is applied includes a liquid crystal display module 50 and a backlight device 10 that is provided on a back surface of the liquid crystal display module 50 (a lower side in the FIG. 1).

The backlight device 10 includes a backlight frame 11 that contains a light-emitting portion, and a light-emitting module 12 on which plural light emitting diodes (referred to as LEDs in the following description) are arrayed. Moreover, the backlight device 10 includes, as a laminated body of optical films, a diffusion plate 13 that is a plate (or a film) scattering and diffusing light to equalize the lightness over the entire surface, and prism sheets 14 and 15 that have a light collection effect to the front. In addition, the backlight device 10 includes a brightness improvement film 16 with a diffusion and reflection type, for improving the brightness, as necessary.

On the other hand, the liquid crystal display module 50 includes a liquid crystal panel 51 as one type of a display panel that is configured by two glass substrates sandwiching liquid crystal in between, and polarization plates 52 and 53 for restricting the oscillation of optical wave to a given direction, which are each laminated on each glass substrate of the liquid crystal panel 51. The liquid crystal display device includes peripheral members (not shown in the figure) such as an LSI (Large Scale Integration) for driving, mounted thereon.

The liquid crystal panel 51 as a display panel includes various components not shown in the figure. For example, the two glass substrates have display electrodes, active elements such as a thin film transistor (TFT), liquid crystal, a spacer, sealant, an orientation film, a common electrode, a protective film, a color filter, and others, none of which is shown in the figure.

Incidentally, the structural unit of the backlight device 10 is selected in an arbitrary way. For example, the unit including only the backlight frame 11 with the light-emitting module 12 may be called as the "backlight device (backlight)" and distributed without including the laminated body of the optical films such as the diffusion plate 13 and the prism sheets 14 and 15.

FIGS. 2A and 2B are views for explaining a partial structure of the backlight device 10. More specifically, FIG. 2A is a top view of the backlight frame 11 on which the light-emitting modules 12 are mounted, which is seen from the liquid crystal display module 50 shown in FIG. 1, and FIG. 2B is a cross sectional view taken along a line IIB-IIB in FIG. 2A. In an instance shown in FIGS. 2A and 2B, a direct-lighting type backlight configuration is adopted in which light sources are disposed directly beneath the back surface of the liquid crystal display module 50. In this backlight configuration, LEDs 21 are arrayed in such a manner that they are almost uniformly distributed with respect to the entire back surface of the liquid crystal display module 50. Therefore, the configuration is different from a side-lighting type backlight configuration in which light sources are disposed on one or two sides of the light guiding plate so that uniform light on a plane surface is obtained by a reflection plate and a light guiding plate.

The backlight frame 11 has a chassis structure made of, for example, aluminum, magnesium, iron, or a metallic alloy including these materials. To the inside of the chassis structure, a polyester film or the like having a high performance of reflecting white light is adhered, for example. It also functions as a reflector. The chassis structure is composed of a rear portion 11a corresponding to the size of the liquid crystal display module 50 and side portions 11b enclosing the four sides of the rear portion 11a. On the rear portion 11a, a heat radiating sheet 18 may be provided.

In an instance shown in FIGS. 2A and 2B, there are provided plural light-emitting modules 12 (e.g., eight light-emitting modules 12 as employed in this instance) as an example of a light-emitting device. Then, the light-emitting modules 12 are each fixed to the backlight frame by plural screws 17 (e.g., two screws 17 for each light-emitting module 12, as employed in this instance) through the heat radiating sheet 18.

Incidentally, a silicone rubber sheet having a multilayer structure with, for example, insulating properties may be used as the heat radiating sheet 18.

The light-emitting module 12 includes a circuit board 20, and plural LEDs 21 mounted on the circuit board 20. The plural LEDs 21 as an example of solid-state light-emitting elements, are formed of red, green and blue LED chips that emit red light, green light and blue light, respectively, and the red, green and blue LED chips are arranged in accordance with a given rule. Mixing of light emitted from the red, green and blue LED chips achieves a light source having a wide range of color reproduction. Incidentally, each of the twenty-eight LEDs 21 constituting the light-emitting module 12 may include one or more LED chips that each emit red, green or blue light, or a pseudo-white solid-state light-emitting element that emits pseudo white light by a combination of a single LED chip that emits blue-violet light and a phosphor may be used as the LED 21. Further, the LED 21 may be configured to include plural LED chips that emit red, green and blue light, respectively, positioned close to each other so as to emit white light. When the plural light-emitting modules 12 are mounted on the backlight frame 11, the LEDs 21 are uniformly disposed throughout the structure of the backlight. Utilization of the entire LEDs 21 present on the backlight frame 11 provides a backlight device 10 that achieves the uniformity of brightness and chromaticity. Incidentally, in an instance shown in FIGS. 2A and 2B, the plural light-emitting modules 12 are provided; however, all LEDs 21 to be used as a light source of the backlight may be collectively combined into one substrate of a single light-emitting module 12.

Each individual LED 21 disposed on the light-emitting module 12 is provided with a lens 30 as a cover member. The lens 30 is fixed so as to cover each individual LED 21. Each lens 30 has functions of protecting each LED 21 and also efficiently and uniformly guiding light emitted from the corresponding LED 21 to the liquid crystal display module 50 (refer to FIG. 1).

FIGS. 3A to 3C show a detail configuration of the above-mentioned light-emitting module 12. FIG. 3A is a top view of a top surface 20a of the circuit board 20 on which the LEDs 21 are mounted and the lenses 30 are attached thereto, FIG. 3B is a back view of a back surface 20b of the circuit board 20, and FIG. 3C is a cross sectional view taken along a line IIIC-IIIC in FIG. 3A. Incidentally, in the present exemplary embodiment, the top surface 20a of the circuit board 20 indicates a first surface or one surface, while the back surface 20b of the circuit board 20 indicates a second surface or the other surface.

The circuit board 20 is rectangular in shape. In the present exemplary embodiment, what is called a glass-epoxy substrate containing a glass-cloth-based epoxy resin as a base is used as the circuit board 20. Also, the circuit board 20 is provided with two opening holes 24 for the screws 17 shown in FIG. 2A.

The lenses 30 correspondingly provided to each of the plural LEDs 21 are formed on the top surface 20a of the circuit board 20. Moreover, a white resist film 26 is formed over the approximately entire area of the top surface 20a of the circuit board 20, and the white resist film 26 has a function of reflecting a part of light emitted from each LED 21. Incidentally, on the top surface 20a of the circuit board 20, a metallic pad (not shown in the figure) for mounting is provided so as to correspond to a position where each LED 21 is attached, and another metallic pad (not shown in the figure) for electrically connecting each LED 21 to the circuit pattern 22 described later. These metallic pads are covered with the lens 30 formed on the top surface 20a and are not exposed to the exterior.

On the other hand, on the back surface 20b of the circuit board 20, the circuit pattern 22 for supplying driving current to each LED 21 (shown with a broken line in FIG. 3B) formed on the top surface 20a. The circuit pattern 22 is made of copper or copper-based metallic material, for example. Each LED 21 is electrically connected to the circuit pattern 22 through a through-hole, a bump or the like that are not shown in the figure. Further, in the present exemplary embodiment, on the back surface 20b of the circuit board 20 on which the circuit pattern 22 is formed, metallic film islands 23 (shown as a shaded areas in FIG. 3B) constituting a heat conductive path for heat radiation. The metallic film islands 23 are made of the same metallic material as the circuit pattern 22, and are formed with design in which the islands have maximum area while no area is shared with the circuit pattern 22. Moreover, on the back surface 20b of the circuit board 20, a terminal 25 for supplying driving current to each LED 21 through the circuit pattern 22 is provided.

The lens 30 formed on the top surface 20a of the circuit board 20 has a mountain shape and is disposed so that its top is approximately located above the upper portion of the corresponding LED 21. Incidentally, the lens 30 is made of a synthetic resin having substantially transparent optical properties in a visible region, and the inside of lens 30 is filled with the synthetic resin.

A description will be given with reference to FIGS. 4A to 4D, with regard to a procedure for making the above-mentioned light-emitting module 12, more specifically, a procedure for forming the lens 30 on the circuit board 20. Incidentally, in FIGS. 4A to 4D, the top and bottom in a vertical direction are indicated by T (Top) and B (Bottom), respectively.

First, the circuit board 20 is prepared on which the circuit pattern 22, the metallic film islands 23, the opening holes 24, the terminal 25, a white resist film 26, and the like are formed. Then, the LEDs 21 are mounted on the top surface 20a of the circuit board 20, as shown in FIG. 4A. Incidentally, when the plural LEDs 21 are mounted on the circuit board 20, the LEDs 21 are electrically connected by wire bonding to metal pads (not shown in the figure) formed on the top surface 20a of the circuit board 20.

Then, the circuit board 20 having the LEDs 21 mounted thereon is set on a dispenser (not shown in the figure). Incidentally, for example, FAD2100 manufactured by Musashi Engineering, Inc. may be used as the dispenser. On this occasion, the circuit board 20 is attached to the dispenser in such a manner that the top surface 20a thereof faces upward in the vertical direction. Then, the dispenser drips a liquid resin 40 onto each of the LEDs 21 from above the mounted position of each of the LEDs 21. The dripped liquid resin 40 covers each of the LEDs 21 at the top surface 20a of the circuit board 20. Under this condition, however, the liquid resin 40 is in an uncured state and has predetermined flowability.

Here, a silicone resin containing about 5 weight percent of silica added thereto is used as the liquid resin 40. The silicone resin serves as a transparent resin having thermosetting properties, which is substantially transparent in the visible region, and the silica serves as a thixotropic agent having thixotropic properties. Incidentally, for example, L-300 manufactured by Tosoh Silica Corporation may be used as the thixotropic agent. Thus, the liquid resin 40 has higher viscosity when being in a stationary state than, for example, when being stirred. Therefore, the liquid resin 40 dripped on the top surface 20a of the circuit board 20 keeps its predetermined mountain shape in the cross section thereof against gravity, although spreading in circular form with each of the LEDs 21 in its center.

Then, the circuit board 20 having the liquid resin 40 dripped thereon is detached from the dispenser and is set on a heat processing apparatus (not shown in the figure). On this occasion, the circuit board 20 is turned upside down and is attached to the heat processing apparatus in such a manner that the top surface 20a thereof faces downward in the vertical direction. In other words, the liquid resin 40 dripped on the top surface 20a of the circuit board 20 faces downward in the vertical direction. At this point in time, the liquid resin 40 still has the flowability, and the liquid resin 40 is deformed by gravity and thus comes close to the dome shape in the cross section. Then, the heat processing apparatus performs heat processing on the circuit board 20 at 150 C.° to cure the liquid resin 40. Thus, the liquid resin 40 is cured in the state where the cross section thereof comes close to the dome shape and its top is located above the upper portion of the corresponding LED 21 (or under the bottom portion, as shown in FIG. 4C), thereby forming the lens 30.

Then, after the completion of the heat processing, the circuit board 20 is detached from the heat processing apparatus, and is again turned upside down as shown in FIG. 4D. As a result, the circuit board 20 having the lenses 30 formed thereon, that is, the light-emitting module 12, is obtained.

In the present exemplary embodiment, the circuit pattern 22 and the metallic film islands 23 are disposed on a back surface 20b of the circuit board 20. This reduces unevenness on the top surface 20a of the circuit board 20, as compared to that on the back surface 20b. This also reduces unevenness on an exposed surface of the white resist film 26 disposed on the top surface 20a of the circuit board 20, as compared to that on the back surface 20b, thus enhancing the smoothness of the white resist film 26.

Thus, the liquid resin 40, when dripped on the top surface 20a of the circuit board 20 as mentioned above, spreads in circular form over the smooth white resist film 26 formed on the top surface 20a of the circuit board 20. This reduces the likelihood of distortion of the cross section of the lens 30 obtained by curing the liquid resin 40.

As opposed to this, for example, if the circuit pattern 22 and the metallic film islands 23 are formed on the top surface 20a of the circuit board 20 and the white resist film 26 is further formed on top of them, unevenness appears also on the exposed surface of the white resist film 26, depending on the formed patterns of the circuit pattern 22 and the metallic film islands 23.

Then, when the liquid resin 40 is dripped on the top surface 20a of the circuit board 20 on which the unevenness is present as mentioned above, the liquid resin 40 spreads along the unevenness on the white resist film 26 formed on the top surface of the circuit board 20. More specifically, the liquid resin 40 flows mainly along the recesses on the white resist film 26 and spreads in a form of a deformed circular shape. Thus, in this case, the likelihood of distortion of the shape of the lens 30 obtained by curing the liquid resin 40 is increased.

Also, in the present exemplary embodiment, after the dripping of the liquid resin 40 on the circuit board 20, the circuit board 20 is put in an upside down state and is subjected to the heat processing to cure the liquid resin 40. In other words, the formation of the lenses 30 on the circuit board 20 without the use of a mold and the upside-down placement of the circuit board 20 before the heat processing suppress the spreading of the liquid resin 40 having the flowability before curing. Thus, the shape of the formed lens 30 gets closer to the dome shape.

DESCRIPTION OF REFERENCE NUMERALS AND SIGNS

Figure 1:
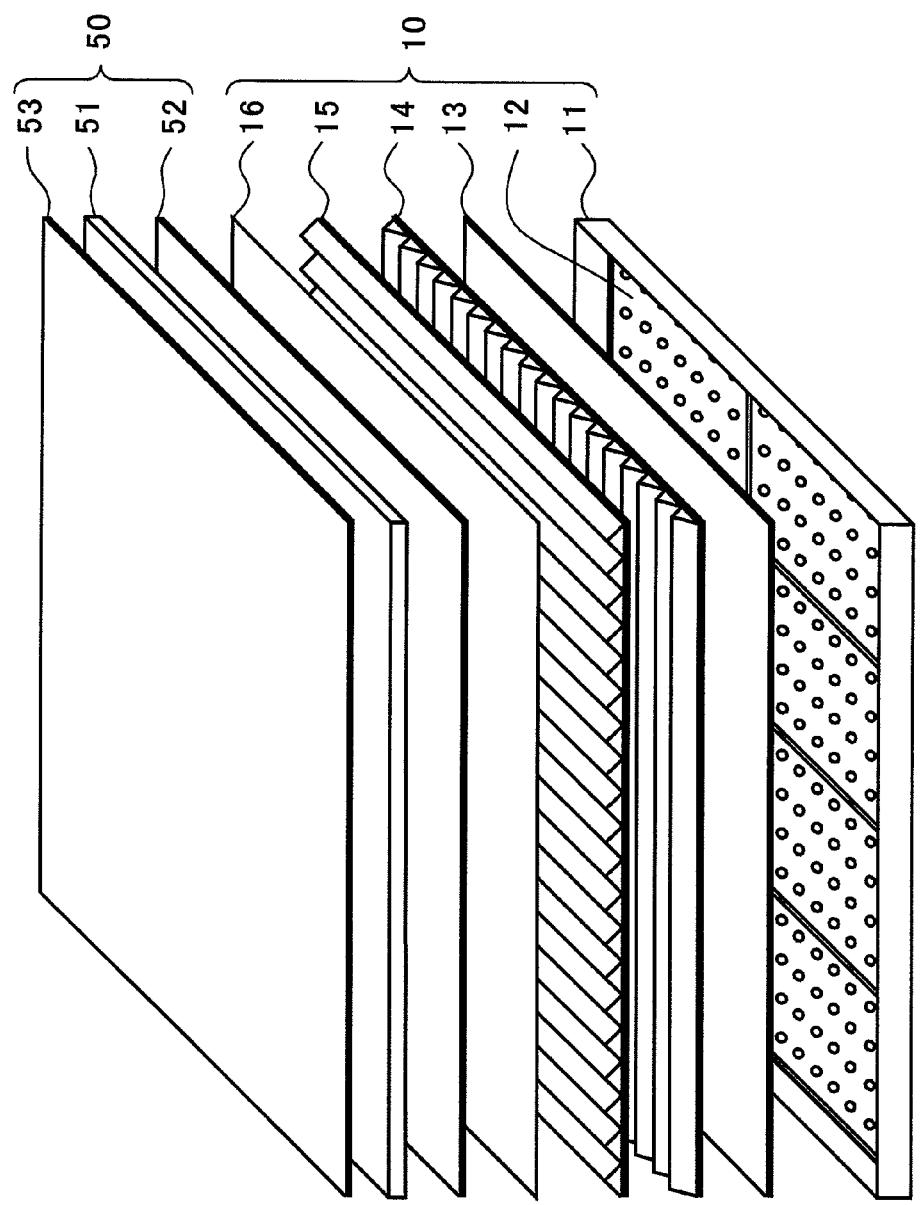
FIG. 1 is a view showing an entire configuration of a liquid crystal display device to which an exemplary embodiment is applied.
Figure 2A:
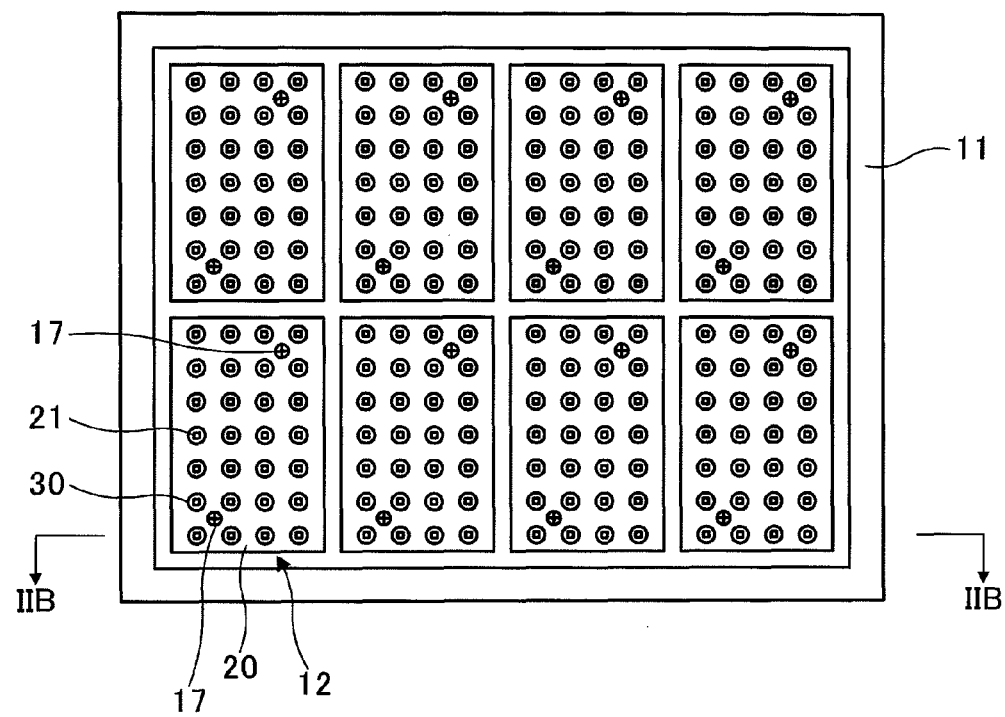
FIGS. 2A and 2B are views for explaining a partial structure of the backlight device.
Figure 2B:
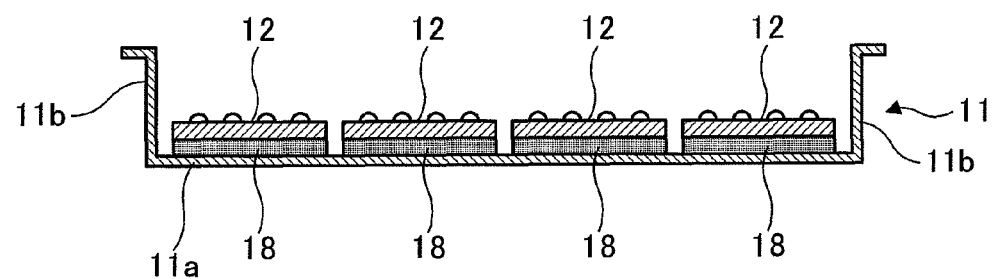
Figure 3A:
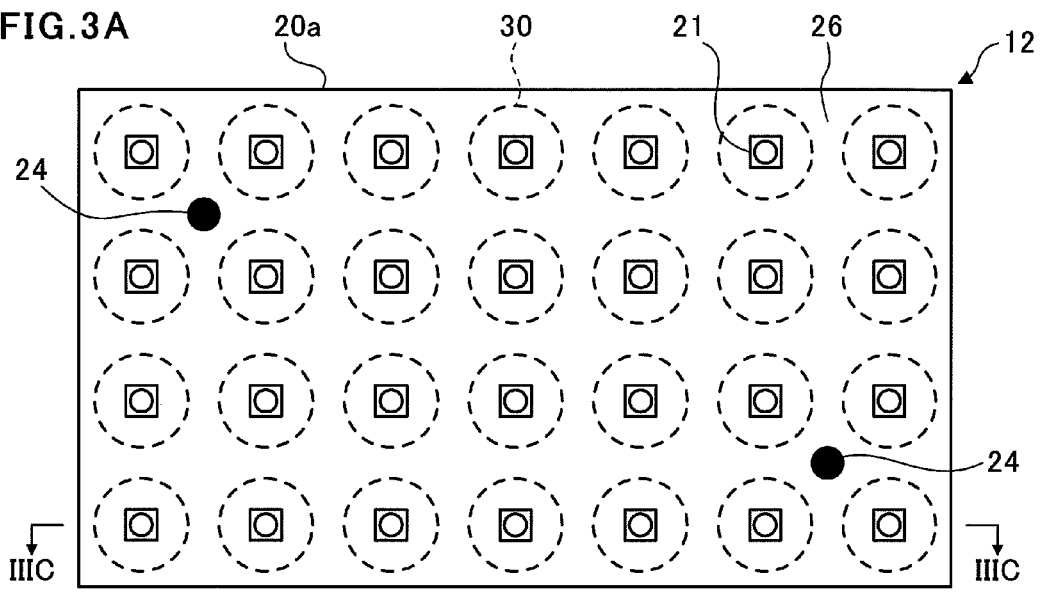
FIGS. 3A to 3C show a configuration of the light-emitting module.
Figure 3B:
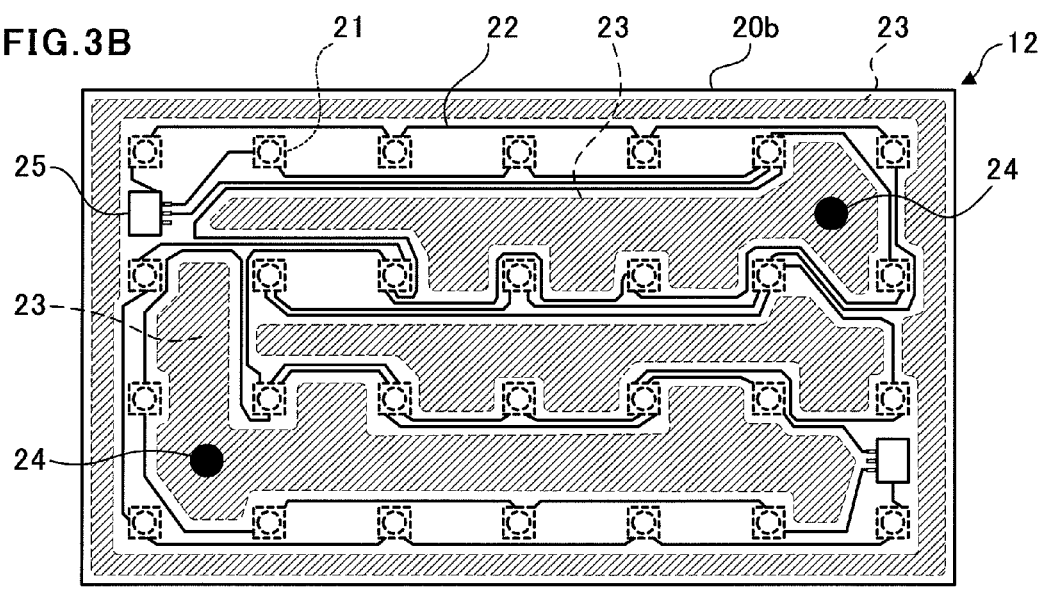
Figure 3C:
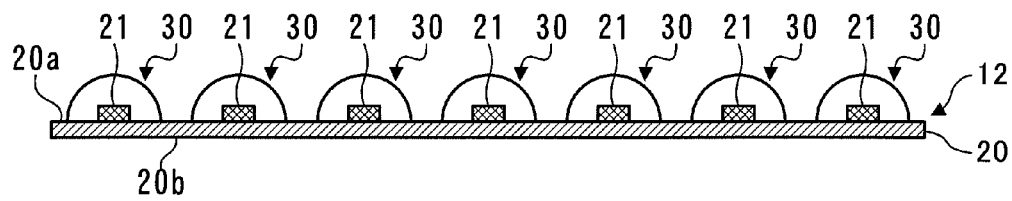
Figure 4A:
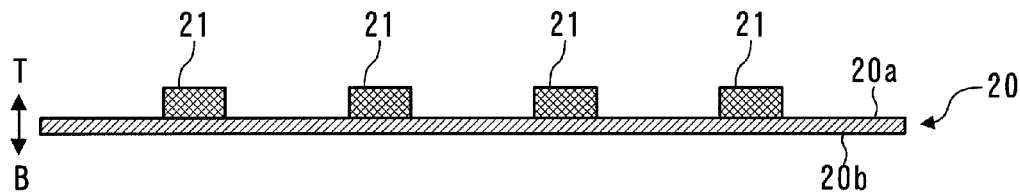
FIGS. 4A to 4D are views for explaining a procedure for forming the lenses in the light-emitting module.
Figure 4B:
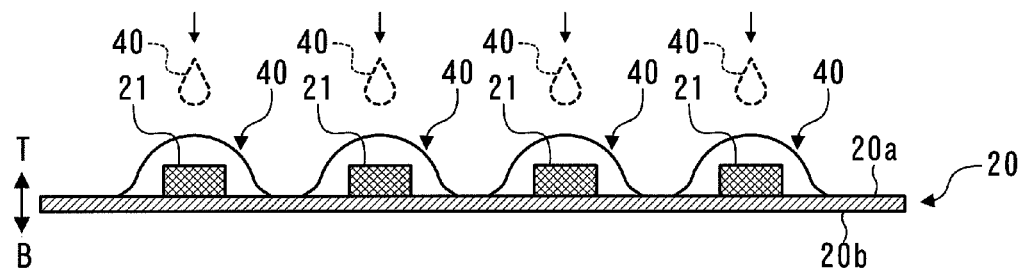
Figure 4C:
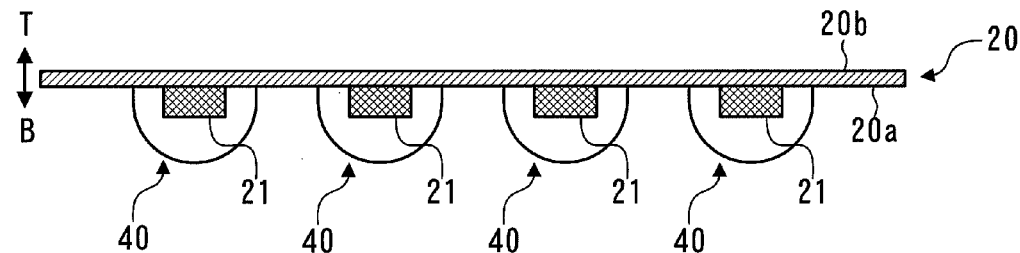
Figure 4D:
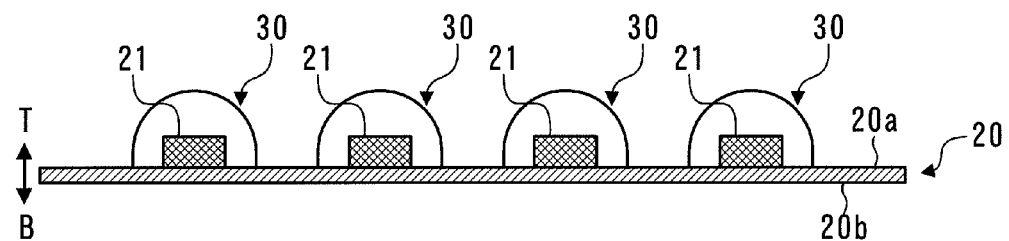

10 . . . backlight device, 11 . . . backlight frame, 11a . . . rear portion, 11b . . . side portion, 12 . . . light-emitting module, 13 . . . diffusion plate, 14 . . . prism sheet, 15 . . . prism sheet, 16 . . . brightness improvement film, 17 . . . screw, 18 . . . heat radiating sheet, 20 . . . circuit board, 20a . . . top surface, 20b . . . back surface, 21 . . . LED, 22 . . . circuit pattern, 23 . . . metallic film island, 26 . . . white resist film, 30 . . . lens, 40 . . . liquid resin, 50 . . . liquid crystal display module, 51 . . . liquid crystal panel, 52 . . . polarization plate, 53 . . . polarization plate

The invention claimed is:

1. A light-emitting device comprising:
    a plurality of solid-state light-emitting elements;
    a substrate that has a first surface on which the plurality of solid-state light-emitting elements are mounted, and a second surface on which wiring is formed, the second surface being opposite to the first surface, the wiring electrically connecting the plurality of solid-state light emitting elements;
    a cover member that is formed by curing a liquid resin dripped on the first surface of the substrate so as to form a dome shape, wherein a separate dome shaped cover member is provided for each of the plurality of solid-state light-emitting elements; and
    a heat radiating sheet which abuts the second surface of the substrate,
    wherein the liquid resin is a silicone resin containing about 5 weight percent of silica.

2. The light-emitting device according to claim 1, wherein the liquid resin is formed of a transparent resin containing a thixotropic agent.

3. A display device including a display panel that displays an image, and a backlight that faces a back side of the display panel and irradiates the display panel with light from the back side of the display panel,
    the backlight comprising:
    a plurality of solid-state light-emitting elements;
    a substrate that has a first surface facing the display panel, on which the plurality of solid-state light-emitting elements are mounted, and a second surface on which wiring is formed, the second surface being opposite to the first surface, the wiring electrically connecting the plurality of solid-state light emitting elements;
    a cover member that is formed by curing a liquid resin dripped on the first surface of the substrate so as to form a dome shape, wherein a separate dome shaped cover member is provided for each of the plurality of solid-state light-emitting elements; and
    a heat radiating sheet which abuts the second surface of the substrate,
    wherein the liquid resin is a silicone resin containing about 5 weight percent of silica.

* * * * *